United States Patent
Amin et al.

(10) Patent No.: US 8,487,291 B2
(45) Date of Patent: Jul. 16, 2013

(54) PROGRAMMABLE METALLIZATION MEMORY CELL WITH LAYERED SOLID ELECTROLYTE STRUCTURE

(75) Inventors: Nurul Amin, Woodbury, MN (US); Insik Jin, Eagan, MN (US); Wei Tian, Bloomington, MN (US); Andrew James Wirebaugh, Hopkins, MN (US); Venugopalan Vaithyanathan, Bloomington, MN (US); Ming Sun, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 546 days.

(21) Appl. No.: 12/362,640

(22) Filed: Jan. 30, 2009

(65) Prior Publication Data

US 2010/0193761 A1    Aug. 5, 2010

(51) Int. Cl.
*H01L 47/00* (2006.01)
*G11C 11/00* (2006.01)

(52) U.S. Cl.
USPC ............... 257/4; 257/E31.027; 257/E45.002; 438/95; 438/102; 438/103; 438/382; 438/385; 365/148; 365/153

(58) Field of Classification Search
USPC ............ 438/95, 102, 103, 382, 385; 365/148, 365/153; 257/4, E31.027, E45.002
See application file for complete search history.

(56) References Cited

U.S. PATENT DOCUMENTS

| | | | |
|---|---|---|---|
| 5,761,115 A | 6/1998 | Kozicki | |
| 7,288,781 B2 * | 10/2007 | Kozicki | 257/4 |
| 2005/0274942 A1 | 12/2005 | Kozicki | |
| 2006/0060832 A1 * | 3/2006 | Symanczyk et al. | 257/3 |
| 2006/0209495 A1 * | 9/2006 | Lee et al. | 361/502 |
| 2009/0014704 A1 | 1/2009 | Chen | |

FOREIGN PATENT DOCUMENTS

| | | |
|---|---|---|
| DE | 10 2006 023608 | 11/2007 |
| DE | 10 2007 021761 | 11/2008 |
| WO | WO 2005/053047 | 6/2005 |

OTHER PUBLICATIONS

PCT Search Report and Written Opinion dated May 11, 2010.

* cited by examiner

*Primary Examiner* — Kimberly Rizkallah
*Assistant Examiner* — Maria Ligai
(74) *Attorney, Agent, or Firm* — Mueting Raasch & Gebhardt PA

(57) ABSTRACT

Programmable metallization memory cells having an active electrode, an opposing inert electrode and a variable resistive element separating the active electrode from the inert electrode. The variable resistive element includes a plurality of alternating solid electrolyte layers and electrically conductive layers. The electrically conductive layers electrically couple the active electrode to the inert electrode in a programmable metallization memory cell. Methods to form the same are also disclosed.

15 Claims, 6 Drawing Sheets

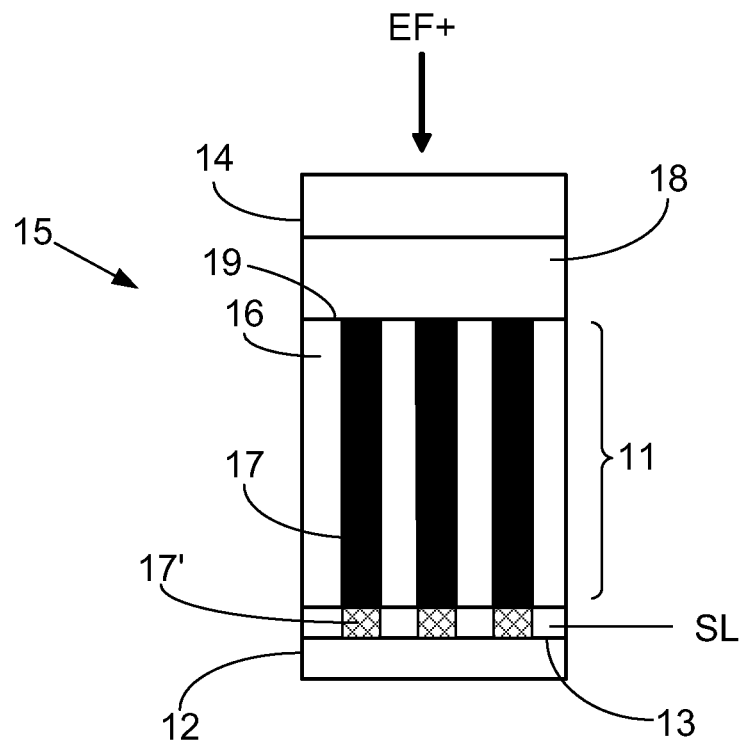
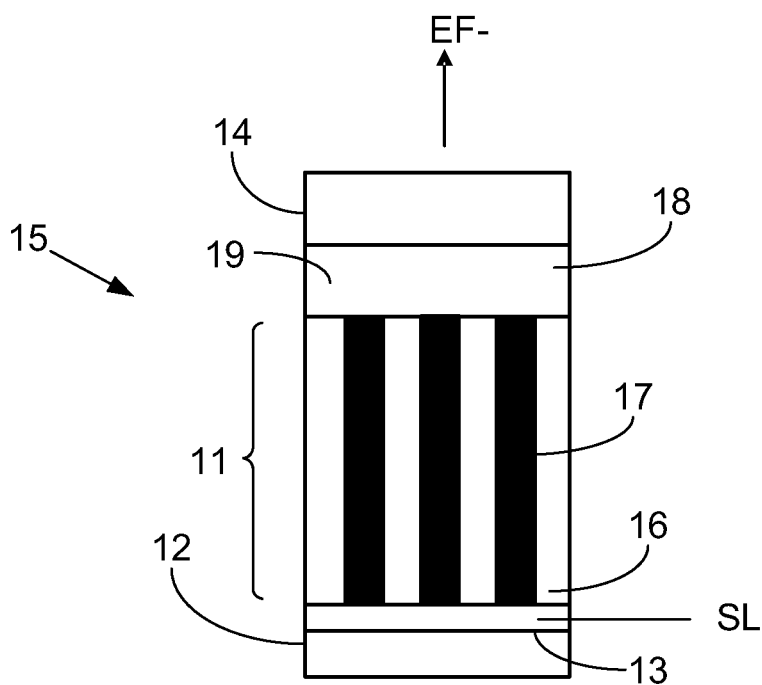

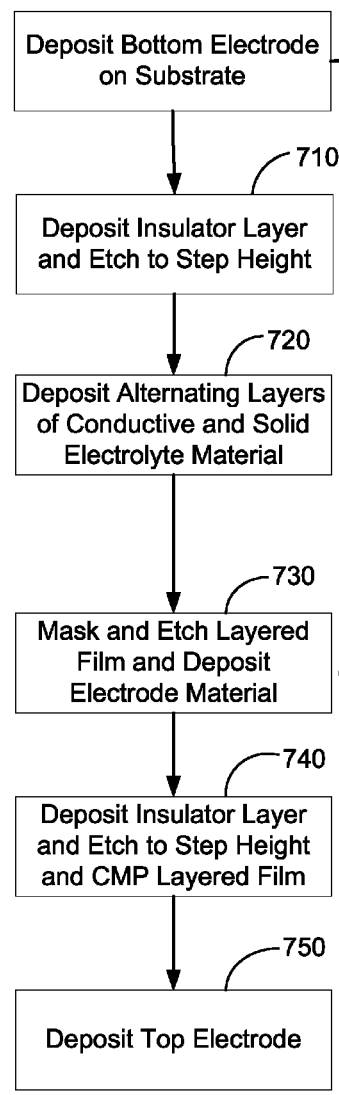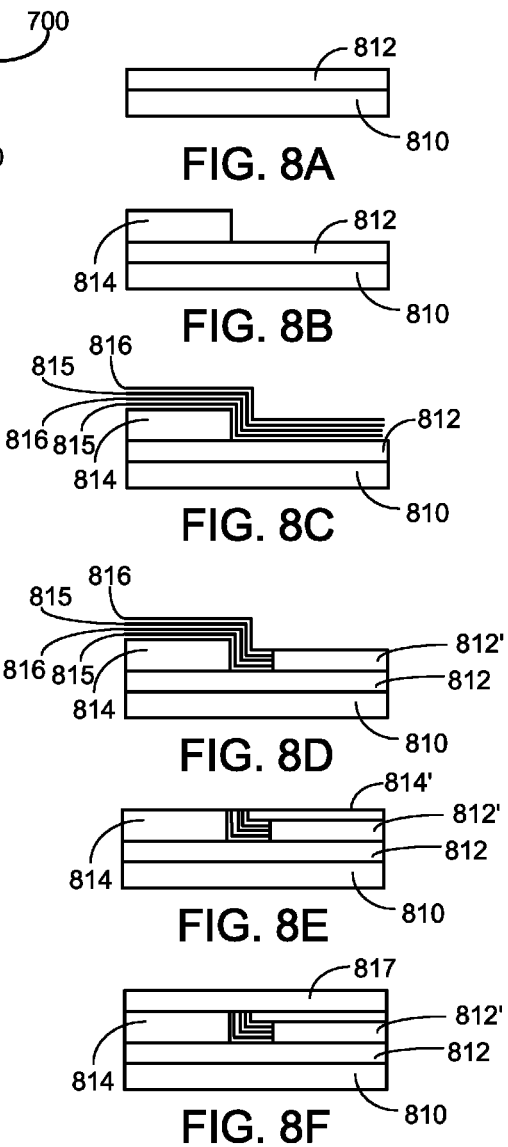

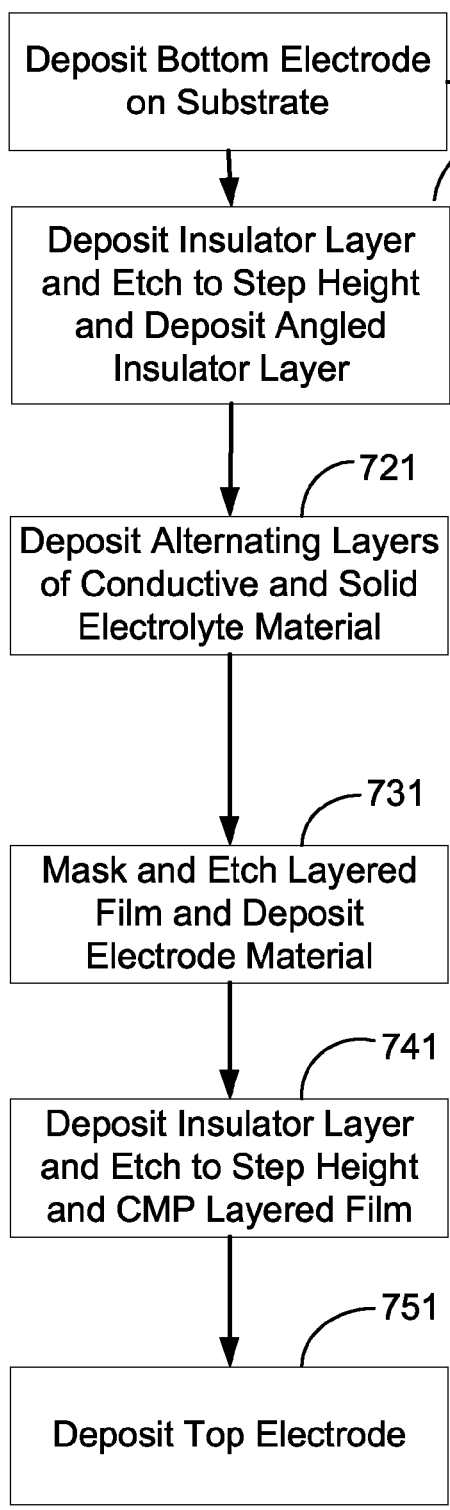
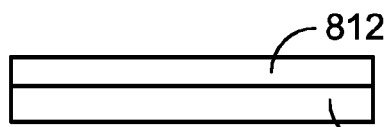
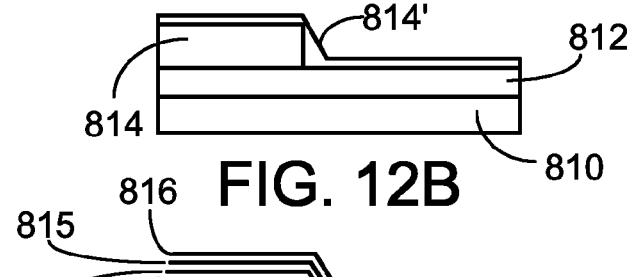
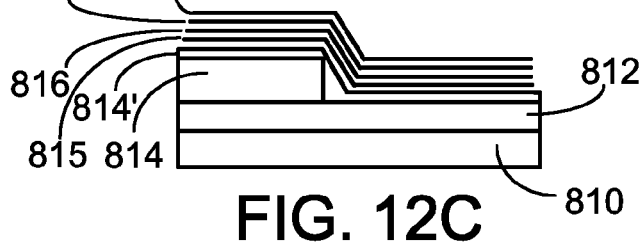
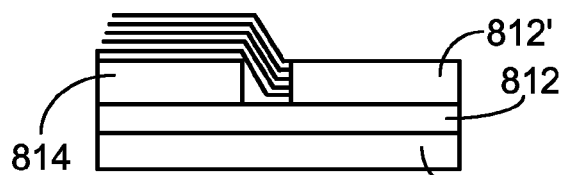
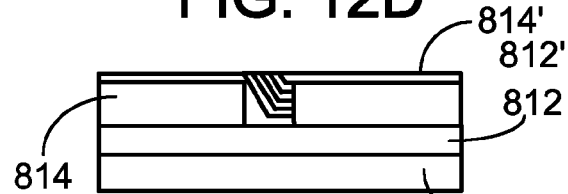
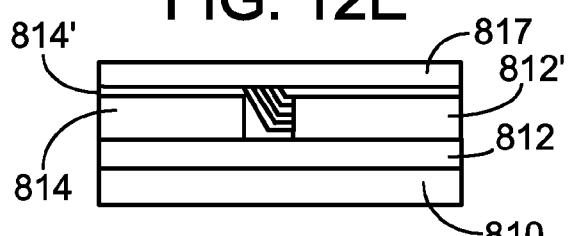

PROGRAMMABLE METALLIZATION MEMORY CELL WITH LAYERED SOLID ELECTROLYTE STRUCTURE

BACKGROUND

Memory devices are common in electronic systems and computers to store data. These memory devices may be volatile memory, where the stored data is lost if the power source is disconnected or removed, or non-volatile, where the stored data is retained even during power interruption. An example of a non-volatile memory device is the programmable metallization cell (PMC) also known as conductive bridging RAM (CBRAM), nanobridge memory, or electrolyte memory.

A PMC utilizes an ion conductor or solid electrolyte such as a chalcogenide type or an oxide type and at least two electrodes (e.g., an anode and a cathode) with the ion conductor or solid electrolyte between the electrodes. When a voltage is applied across the electrodes, conducting filaments rapidly grow from the cathode through the ion conductor or solid electrolyte towards the anode. This gives rise to a low resistance state. When an electric field of opposite polarity is applied across the electrodes, the conducting filaments dissolve and the conducing paths are disrupted. This gives rise to the high resistance state. The two resistance states that are switchable by the application of the appropriate electric field are used to store the memory data bit of "1" or "0".

Although the conducting filaments provide an accurate path for current flow from one electrode to the other, the creation and dissolution of the conducting filaments can be unpredictable. The conductive paths are generated and dissolved at random locations when the electric potential of a proper value, and polarity, is applied. Thus, the position and occurrence of the filaments is not accurate or reproducible. These factors lead to variation in cell behavior, especially as the cell sized is scaled down for high packing densities. Therefore, improvements are needed in PMC to reduce individual cell behavior variability.

BRIEF SUMMARY

The present disclosure relates to programmable metallization memory cells having a layered solid electrolyte and methods of forming the same are disclosed.

In one illustrative embodiment the programmable metallization memory cell includes an active electrode, an opposing inert electrode and a variable resistive element separating the active electrode from the inert electrode. The variable resistive element includes a plurality of alternating solid electrolyte layers and electrically conductive layers. The electrically conductive layers electrically couple the active electrode to the inert electrode.

One illustrative method of forming a programmable metallization memory cell includes depositing a plurality of alternating solid electrolyte layers and electrically conductive layers on a first electrode, forming a variable resistive element and then depositing a second electrode on the variable resistive element, the electrically conductive layers electrically couple the first electrode to the second electrode.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 3 is a schematic diagram of another illustrative programmable metallization memory cell in a low resistance state;

FIG. 4 is schematic diagram of the illustrative programmable metallization memory cell shown in FIG. 3 in a high resistance state;

FIG. 7 is a flow diagram of an illustrative method of forming a programmable metallization memory cell with solid electrolyte and conductive layers;

FIG. 8A-8F are schematic cross-section views of a programmable metallization memory cell with a layered variable resistive element at various stages of manufacture;

FIG. 11 is a flow diagram of another illustrative method of forming a programmable metallization memory cell with angled solid electrolyte and conductive layers; and FIG. 12A-12F are schematic cross-section views of another programmable metallization memory cell with an angled layered variable resistive element at various stages of manufacture.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
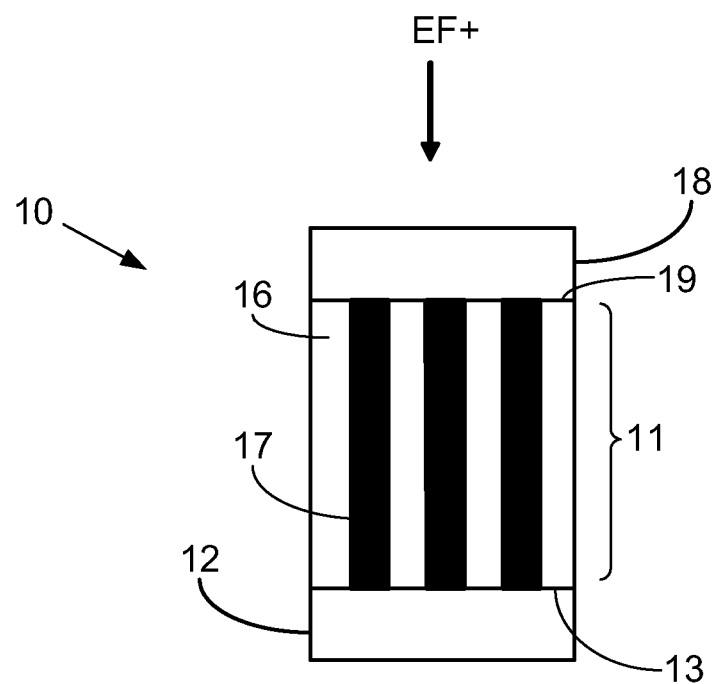
FIG. 1 is a schematic diagram of an illustrative programmable metallization memory cell in a low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

The present disclosure relates to programmable metallization memory cells having a layered solid electrolyte and methods of forming the same are disclosed. In particular, the present disclosure relates to programmable metallization memory cells having alternating layers of solid electrolyte and conductive metal. These layers can be generally non-parallel with major surfaces of the electrodes. In many embodiments, these layers are generally orthogonal to the major surfaces of the electrodes. Thus, the layers of conductive material are "pre-planted" between the electrodes to provide a reproducible and accurate conductive path between the electrodes when the cell is in the low resistance state. In some embodiments, an electrode major surface includes areas of insulating material and areas that do not include insulating material to form areas of higher current densities where electrochemical reaction preferentially occurs. While the present disclosure is not so limited, an appreciation of various aspects of the disclosure will be gained through a discussion of the examples provided below.

FIG. 1 is a schematic diagram of an illustrative programmable metallization memory cell 10 in a low resistance state. Programmable metallization cell (PMC) memory is based on the physical formation of electrically conducting filaments or paths within an ion conductor solid electrolyte material. The PMC memory cell 10 includes a variable resistive element 11 separating an electrochemically active or first electrode 18 from an inert electrode or second metal electrode or contact 12.

The variable resistive element 11 includes a plurality of alternating solid electrolyte layers 16 and electrically conductive (or active metal) layers 17. The electrically conductive layers 17 electrically couple the electrochemically active electrode 18 to the inert electrode 12 as illustrated in the low resistance state FIG. 1. In some embodiments, the alternating solid electrolyte layers 16 and electrically conductive layers 17 extend in a non-parallel direction with the electrochemically active electrode 18 major surface 19 or the inert electrode 12 major surface 13. In some embodiments the alternating solid electrolyte layers 16 and electrically conductive layers 17 extend in an orthogonal direction with the electrochemically active electrode 18 major surface 19 or the inert electrode 12 major surface 13. In some embodiments, at least a portion of each of the alternating solid electrolyte layers 16 and electrically conductive layers 17 extend in an orthogonal direction with the electrochemically active electrode 18 major surface 19 or the inert electrode 12 major surface 13 (as illustrated in FIG. 8F). In some embodiments, at least a portion of each of the alternating solid electrolyte layers 16 and electrically conductive layers 17 are slanted relative to the electrochemically active electrode 18 major surface 19 or the inert electrode 12 major surface 13 (as illustrated in FIG. 12F).

While four electrically conductive layers 17 and three solid electrolyte layers 16 are illustrated, it is understood that the variable resistive element 11 can includes any useful number of alternating electrically conductive layers 17 and solid electrolyte layers 16. For example, the variable resistive element 11 can include from 2 to 1000 layers or from 10 to 500 layers, depending on relative thickness of each layer. In some embodiments, the electrically conductive layers 17 can have a thickness in a range from 1 to 1000 Angstroms, or from 5 to 500 Angstroms, or less than 100 Angstroms. Similarly, the solid electrolyte layers 16 can have a thickness in a range from 1 to 1000 Angstroms, or from 5 to 500 Angstroms, or less than 100 Angstroms. The ratio of conductive layer thickness to solid electrolyte thickness can be 1:1 to 1:1000 or 1:10 to 1:100, as desired. In FIG. 1 the alternating solid electrolyte layers 16 and electrically conductive layers 17 are shown to cover the entirety of the electrochemically active electrode 18 major surface 19 or the inert electrode 12 major surface 13, however in some embodiments the alternating solid electrolyte layers 16 and electrically conductive layers 17 can cover less than the entirety of the electrochemically active electrode 18 major surface 19 or the inert electrode 12 major surface 13. The plurality of alternating solid electrolyte layers 16 and electrically conductive layers 17 can be formed as described below.

The electrochemically active electrode 18 described herein can be formed of any useful electrochemically active material such as, silver (Ag) or copper (Cu). The active electrode 18 can have any useful thickness, for example, from 50 Angstroms to 5000 Angstroms.

Figure 2:
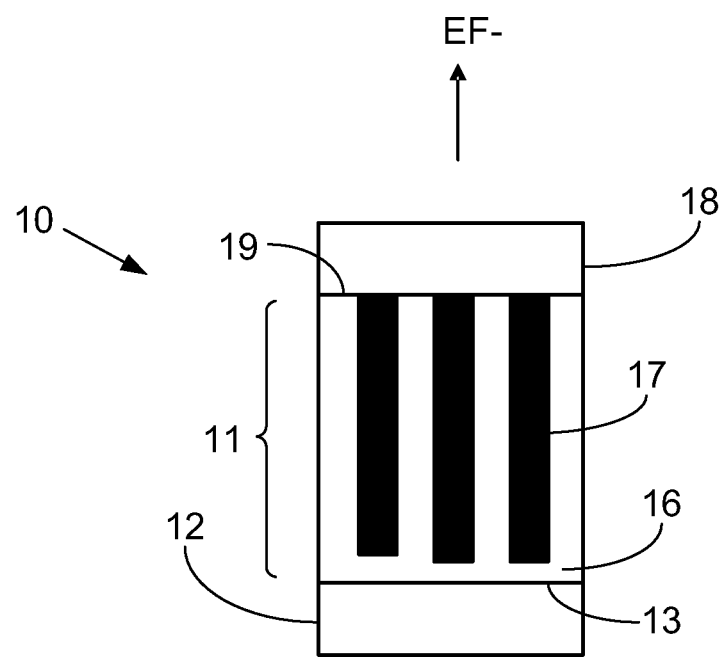
FIG. 2 is schematic diagram of the illustrative programmable metallization memory cell shown in FIG. 1 in a high resistance state.

The second metal contact 12 can be formed of any useful metallic material. In many embodiments, second metal contact 12 is formed of electrochemically inert metals such as, tungsten (W), nickel (Ni), molybdenum (Mo), platinum (Pt), gold (Au), palladium (Pd), and rhodium (Rh) for example. In some embodiments the second metal contact 12 has two or more metal layers, where the metal layer closest to the ion conductor solid electrolyte material 16 is electrochemically inert while additional layers can be electrochemically active. The second metal contact 12 can also be referred to as a bottom electrode. The metal contact 12 can be, but need not be formed on a substrate. The substrate, if utilized, can include silicon, a mixture of silicon and germanium, and other similar materials. FIG. 1 and FIG. 2 does not depict an optional substrate.

The ion conductor solid electrolyte material 16 can be formed of any useful material that provides for the formation of conducting filaments within the ion conductor solid electrolyte material and extend between the electrochemically active electrode 18 and the inert metal contact 12 upon application of an electric field EF+. In many embodiments the ion conductor solid electrolyte material 16 is a chalcogenide or glass type material such as, for example, $GeS_2$, $GeSe_2$, $CuS_2$, CuTe, and the like. In other embodiments the ion conductor solid electrolyte material 16 is an oxide-type material such as, for example, $WO_3$, $SiO_2$, $Gd_2O_3$, $Al_2O_3$, and the like.

Application of an electric field EF+ across the electrochemically active electrode 18 and the inert metal contact 12 allow metal cations (i.e., silver ions) to migrate toward the inert metal contact 12 and creates a conductive filament or conductive path or layer, electrically connecting the inert metal contact 12 to the electrochemically active electrode 18. This electrical connection gives rise to the low resistance state of the programmable metallization memory cell 10.

Reading the PMC 10 simply requires a small voltage applied across the cell. If the conducting filaments are present and electrically connect the inert metal contact 12 to the electrochemically active electrode 18, the resistance will be low, leading to higher current, which can be read as a "1". If conducting filament do not electrically connect the inert metal contact 12 to the electrochemically active electrode 18, the resistance is higher, leading to low current, which can be read as a "0" as illustrated in FIG. 2.

FIG. 2 is schematic diagram of an illustrative programmable metallization memory cell 10 in a high resistance state. Application of an electric field of opposite polarity FE– ionizes the conducting filaments or electrically conducting layers 17 and dissolves ions from the electrically conducting layers 17 back to the electrochemically active electrode 18 (or solid electrolyte material 16), breaking the electrical connection between the inert metal contact 12 to the electrochemically active electrode 18 and gives rise to the high resistance state of the programmable metallization memory cell 10. The low resistance state and the high resistance state are switchable with an applied electric field and are used to store the memory bit "1" and "0". While the electrically conducting layers 17 are shown spaced apart from the inert metal electrode 12, it is understood that the electrically conducting layers 17 could be spaced apart from the electrochemically active electrode 18 and/or broken along the length of the electrically conducting layer 17 to create the high resistance state.

As described below, the programmable metallization memory cell 10 is formed with the electrically conducting layers 17 "pre-planted" within the variable resistive element 11 via the alternating layered deposition of the electrically conducting layers 17 and the solid electrolyte layers 16. Thus, one advantage provided by the pre-planted electrically conducting layers 17 is that the electrical connection that gives rise to the low resistance state is pre-set during formation of the programmable metallization memory cell 10 and it is believed that a majority of the electrically conducting layers 17 remain intact even in the high resistance state so that a predictable electrical connection is re-established when setting the programmable metallization memory cell 10 back to the low resistance state. Thus, programmable metallization memory cell 10 variability is believed to be reduced.

FIG. 3 is a schematic diagram of another illustrative programmable metallization memory cell 15 in a low resistance state. FIG. 4 is schematic diagram of the illustrative programmable metallization memory cell 15 shown in FIG. 3 in a high resistance state. These programmable metallization memory cells 15 are similar to the programmable metallization memory cells 10 illustrated in FIG. 1 and FIG. 2. However, these programmable metallization memory cells 15 include a switching layer SL separating the variable resistive element 11 from the inert electrode 12. In some embodiments, the switching layer SL includes a material that is a composite of conductive and insulator material to have predefined areas of higher current densities. It is understood that the switching layer SL can alternatively, or in addition, separate the variable resistive element 11 from the electrochemically active electrode 18. In some embodiments the switching layer SL includes a solid electrolyte material. The ion conductor solid electrolyte material is described above in relation to FIG. 1 and FIG. 2.

The PMC memory cell 10 includes a variable resistive element 11 separating an electrochemically active electrode 18 from an inert electrode or first metal electrode or contact 12. The illustrative PMC memory cell 10 includes a second metal electrode or contact 14 in electrical contact with the electrochemically active electrode 18. A switching layer SL separates the variable resistive element 11 from the electrochemically active electrode 18.

The variable resistive element 11 includes a plurality of alternating solid electrolyte layers 16 and electrically conductive layers or regions 17 and 17'. The electrically conductive layers 17 and 17' electrically couple the electrochemically active electrode 18 to the inert electrode 12 as illustrated in the high resistance state FIG. 3. In some embodiments, the alternating solid electrolyte layers 16 and electrically conductive layers 17 extend in a non-parallel direction with the electrochemically active electrode 18 major surface 19 or the inert electrode 12 major surface 13. In some embodiments the alternating solid electrolyte layers 16 and electrically conductive layers 17 extend in an orthogonal direction with the electrochemically active electrode 18 major surface 19 or the inert electrode 12 major surface 13. The alternating solid electrolyte layers 16 and electrically conductive layers 17 are described above in reference to FIG. 1 and FIG. 2. In some embodiments, at least a portion of each of the alternating solid electrolyte layers 16 and electrically conductive layers 17 and 17' extend in an orthogonal direction with the electrochemically active electrode 18 major surface 19 or the inert electrode 12 major surface 13. In some embodiments, at least a portion of each of the alternating solid electrolyte layers 16 and electrically conductive layers 17 and 17' are slanted relative to the electrochemically active electrode 18 major surface 19 or the inert electrode 12 major surface 13.

In some embodiments, the electrically conductive layers 17 are formed of the same material as the electrically conductive layers 17'. In these embodiments, the electrically conductive layers 17 and 17' are formed of the same type of material forming the electrochemically active electrode 18 which is any useful electrochemically active material such as, silver (Ag) or copper (Cu).

In some embodiments, the electrically conductive layers 17 are formed of a different material from the electrically conductive layers 17'. For example, the electrically conductive layers 17 can be an electrochemically inert metal such as tungsten (W), nickel (Ni), molybdenum (Mo), platinum (Pt), gold (Au), palladium (Pd), and rhodium (Rh), and the electrically conductive layers 17' form within the switching layer SL upon application of the electric field EF+. Thus, the electrically conductive layers 17' that form within the solid electrolyte layer SEL are formed of the same type of material forming the electrochemically active electrode 18 which is any useful electrochemically active material such as, silver (Ag) or copper (Cu).

Application of an electric field of opposite polarity FE– ionizes the electrically conductive layers 17' and dissolves ions from the electrically conductive layers 17' back to the electrochemically active electrode 18 (or switching layer SL, or solid electrolyte layers 16), breaking the electrical connection between the inert metal contact 12 to the electrochemically active electrode 18 and gives rise to the high resistance state of the programmable metallization memory cell 10.

Figure 5:
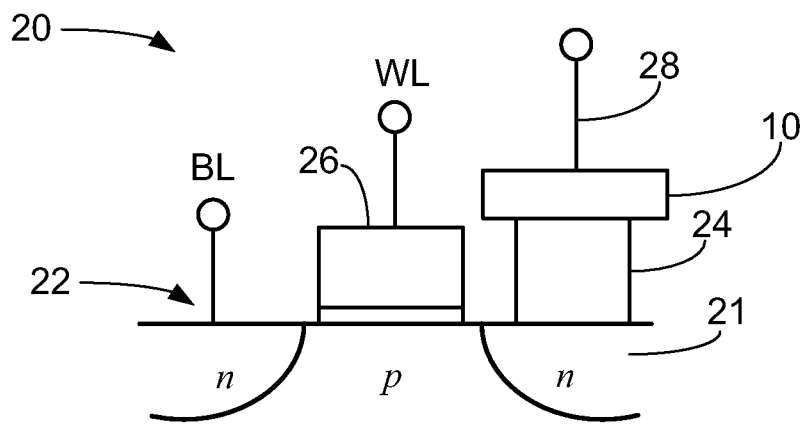
FIG. 5 is a schematic diagram of an illustrative programmable metallization memory unit including a semiconductor transistor.

FIG. 5 is a schematic diagram of an illustrative programmable metallization memory unit 20 including a semiconductor transistor 22. The programmable metallization memory unit 20 includes a programmable metallization memory cell 10, as described herein electrically coupled to a semiconductor transistor 22 via an electrically conducting element 24. The semiconductor transistor 22 includes a semiconductor substrate 21 having doped regions (e.g., illustrated as n-doped regions) and a channel region (e.g., illustrated as a p-doped channel region) between the n-doped regions The transistor 22 includes a gate 26 electrically coupled to a word line WL to allow selection and current to flow from the bit line BL to the second metal contact 28. An array of programmable metallization memory unit 20 can be formed on a semiconductor substrate utilizing semiconductor fabrication techniques.

Figure 6:
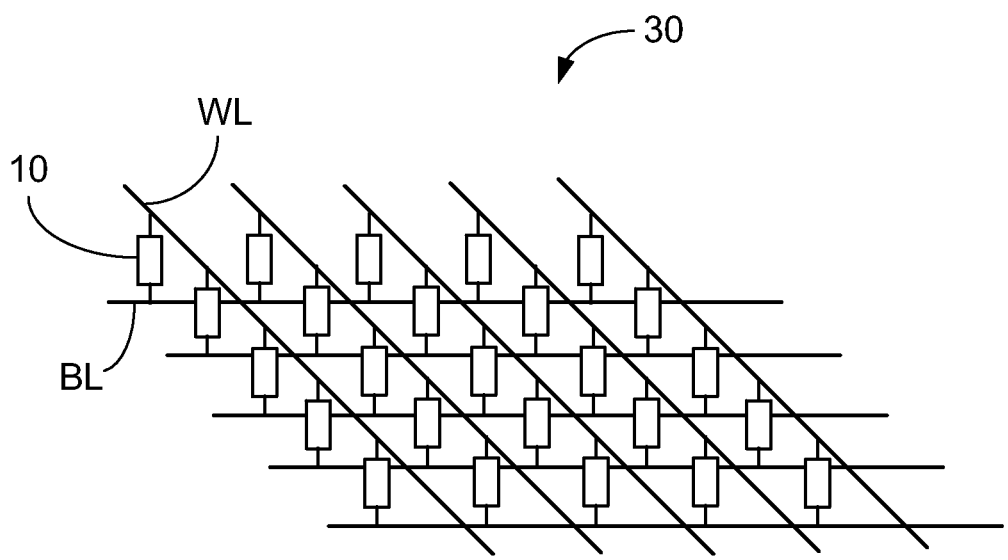
FIG. 6 is a schematic diagram of an illustrative programmable metallization memory array.

FIG. 6 is a schematic diagram of an illustrative programmable metallization memory array 30. The programmable metallization memory array 30 includes a plurality of word lines WL and a plurality of bit lines BL forming a cross-point array. At each cross-point a programmable metallization memory cell 10 is electrically coupled to a word line WL and a bit line BL. A select device (not shown) can be at each cross-point or at each word line WL and bit line BL. Source lines can also be used as design needs arise.

FIG. 7 is a flow diagram of an illustrative method of forming a programmable metallization memory cell with solid electrolyte and conductive layers. FIG. 8A-8F are schematic cross-section views of a programmable metallization memory cell with a layered variable resistive element at various stages of manufacture.

The process includes depositing a bottom electrode 812 on a substrate 810 at block 700. The substrate 810 includes, but is not limited to silicon, a mixture of silicon and germanium, and other similar material. The bottom electrode 812 can be formed of an electrochemically active or inert metal. The bottom electrode 812 can be formed using known deposition methods such as physical vapor deposition, chemical vapor deposition, electrochemical deposition, molecular beam epitaxy and atomic layer deposition.

An insulator layer 814 is deposited to a desired step height and etched to expose a portion of the bottom electrode 812 at block 710. The insulator layer 814 can be formed of any useful electrically insulating material such as silicon oxide and the like. The insulator layer 814 can be etched using know etching techniques such as ion milling, selective etching, plasma etching and the like. The step height determines the spacing between the active and inert electrodes of the programmable metallization memory cell.

Alternating layers of solid electrolyte material 815 and electrically conductive material 816 is deposited on the exposed bottom electrode 812 and on the side and top of the insulator layer 814 at block 720. While the insulator layer 814 side wall is illustrated being orthogonal to the major surface of the exposed bottom electrode 812, it is understood that the side wall of the insulator layer 814 could form any angle from 91 to 179 degrees with the major surface of the exposed bottom electrode 812 (illustrated in FIGS. 11 and 12). The alternating layers of solid electrolyte material 815 and electrically conductive material 816 forms the variable resistive element described above.

A portion of the alternating layers of solid electrolyte material 815 and electrically conductive material 816 is masked and the remaining portion of the alternating layers of solid electrolyte material 815 and electrically conductive material 816 deposited on the exposed bottom electrode 812 is etched at block 730. Bottom electrode material is deposited on the exposed bottom electrode 812 to form a bottom electrode layer second portion 812'.

An insulator layer second portion 814' is deposited on the bottom electrode layer second portion 812' and exposed solid electrolyte material 815 and electrically conductive material 816 to the desired step height at block 740. And the remaining exposed portion of the alternating layers of solid electrolyte material 815 and electrically conductive material 816 is removed via semiconductor fabrication techniques such as chemical mechanical polishing.

A top electrode 817 is deposited on the insulator layer 814, insulator layer second portion 814' and variable resistive element (formed by the alternating layers of solid electrolyte material 815 and electrically conductive material 816) at block 750. The programmable metallization memory cell can then be masked and etched to the desired size and shape.

Figure 9:
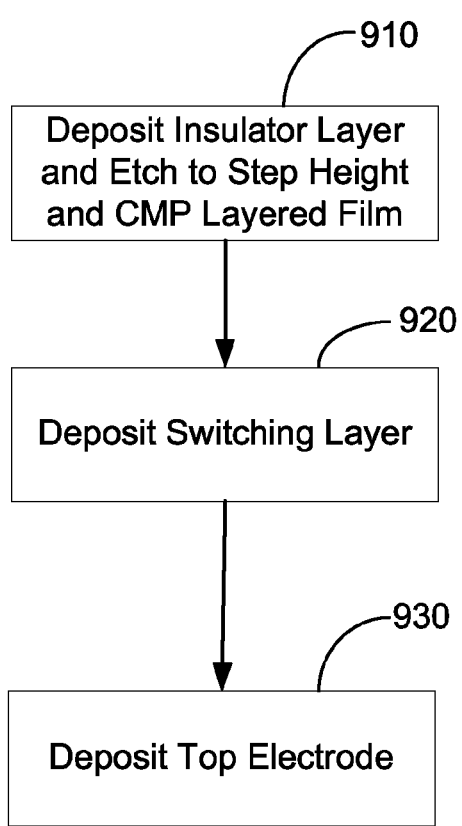
FIG. 9 is a flow diagram of an illustrative method of forming a programmable metallization memory cell with solid electrolyte and conductive layers.
Figure 10A:
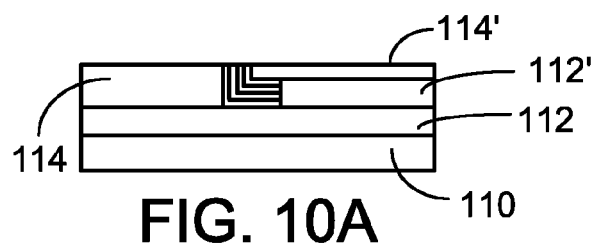
FIG. 10A-10C are schematic cross-section views of another programmable metallization memory cell with a layered variable resistive element at various stages of manufacture.
Figure 10B:
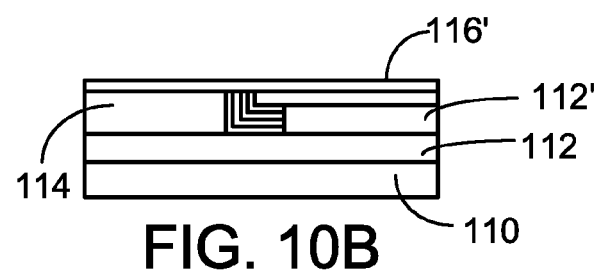
Figure 10C:
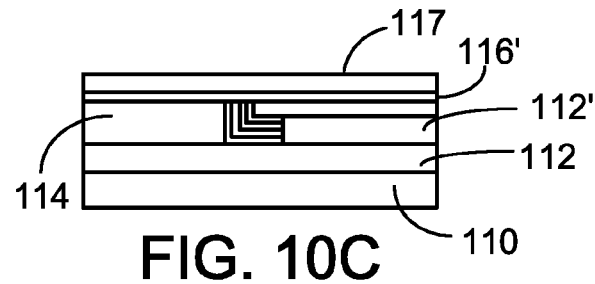

FIG. 9 is a flow diagram of an illustrative method of forming a programmable metallization memory cell with a solid electrolyte and conductive layers. FIG. 10A-10C are schematic cross-section views of another programmable metallization memory cell with a layered variable resistive element at various stages of manufacture.

The programmable metallization memory cell is formed in a similar manner as illustrated and described in FIG. 7 and FIG. 8A-8D. An insulator layer second portion 114' is deposited on the bottom electrode layer second portion 112' to the desired step height at block 910. And the remaining exposed portion of the alternating layers of solid electrolyte material 115 and electrically conductive material 116 is removed via semiconductor fabrication techniques such as chemical mechanical polishing.

Switching layer 116' is deposited on the insulator layer 114, insulator layer second portion 114' and variable resistive element (formed by the alternating layers of solid electrolyte material and electrically conductive material) at block 920. The switching layer 116' can be any useful ion conductor solid electrolyte or other composite material with variable current densities as described above.

A top electrode 117 is deposited on the layer of solid electrolyte 116' at block 930. The programmable metallization memory cell can then be masked and etched to the desired size and shape.

FIG. 11 is a flow diagram of another illustrative method of forming a programmable metallization memory cell with angled solid electrolyte and conductive layers. FIG. 12A-12C are schematic cross-section views of another programmable metallization memory cell with an angled layered variable resistive element at various stages of manufacture.

The process includes depositing a bottom electrode 812 on a substrate 810 at block 701. The substrate 810 includes, but is not limited to silicon, a mixture of silicon and germanium, and other similar material. The bottom electrode 812 can be formed of an electrochemically active or inert metal. The bottom electrode 812 can be formed using known deposition methods such as physical vapor deposition, chemical vapor deposition, electrochemical deposition, molecular beam epitaxy and atomic layer deposition.

An insulator layer 814 is deposited to a desired step height and etched to expose a portion of the bottom electrode 812 and an angled insulator layer 814' is deposited at block 711. The insulator layer 814 and angled insulator layer 814' can be formed of any useful electrically insulating material such as silicon oxide and the like. The insulator layer 814 can be etched using know etching techniques such as ion milling, selective etching, plasma etching and the like. The step height determines the spacing between the active and inert electrodes of the programmable metallization memory cell.

The angled insulator layer 814' forms a deposition plane that is at an angle from 1 to 89 degrees from a major surface plane of the bottom electrode 812 as illustrated. In some embodiments, angled insulator layer 814' forms a deposition plane that is at an angle from 10 to 75 degrees from a major surface plane of the bottom electrode 812. In some embodiments, angled insulator layer 814' forms a deposition plane that is at an angle from 25 to 50 degrees from a major surface plane of the bottom electrode 812.

Alternating layers of solid electrolyte material 815 and electrically conductive material 816 is deposited on the angled insulator layer 814' at block 721. The alternating layers of solid electrolyte material 815 and electrically conductive material 816 forms the variable resistive element described above.

A portion of the alternating layers of solid electrolyte material 815 and electrically conductive material 816 is masked and the remaining portion of the alternating layers of solid electrolyte material 815 and electrically conductive material 816 deposited on the exposed angled insulator layer 814' is etched at block 731. Bottom electrode material is deposited on the exposed bottom electrode 812 to form a bottom electrode layer second portion 812'.

An insulator layer second portion 814' is deposited on the bottom electrode layer second portion 812' and exposed solid electrolyte material 815 and electrically conductive material 816 to the desired step height at block 741. And the remaining exposed portion of the alternating layers of solid electrolyte material 815 and electrically conductive material 816 is removed via semiconductor fabrication techniques such as chemical mechanical polishing.

A top electrode 817 is deposited on the insulator layer 814, insulator layer second portion 814' and variable resistive element (formed by the alternating layers of solid electrolyte material 815 and electrically conductive material 816) at block 751. The programmable metallization memory cell can then be masked and etched to the desired size and shape.

Thus, embodiments of the PROGRAMMABLE METALLIZATION MEMORY CELL WITH LAYERED SOLID ELECTROLYTE STRUCTURE are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A programmable metallization memory cell comprising:
an active electrode having an active electrode major surface;
an inert electrode having an inert electrode major surface; and
a variable resistive element between the active electrode and the inert electrode, the variable resistive element comprising a plurality of parallel solid electrolyte layers and a plurality of parallel electrically conductive metal layers, the solid electrolyte layers and the electrically conductive metal layers are parallel to each other and layered in an alternating fashion, the plurality of parallel alternating solid electrolyte layers and electrically conductive layers extend in a non-parallel direction with the active electrode major surface and the inert electrode major surface, and the electrically conductive metal layers comprise an electrochemically inert metal.

2. A programmable metallization memory cell according to claim 1 wherein the plurality of alternating solid electrolyte layers and electrically conductive metal layers extend in an orthogonal direction with respect to the active electrode major surface or the inert electrode major surface.

3. A programmable metallization memory cell according to claim 1 wherein the electrically conductive metal layers have a thickness of less than 100 Angstroms.

4. A programmable metallization memory cell according to claim 1 further comprising a switching layer separating the variable resistive element from either the active electrode or the inert electrode.

5. A programmable metallization memory cell according to claim 1 wherein the electrically conductive metal layers comprise silver or copper.

6. A programmable metallization memory cell according to claim 1 wherein the solid electrolyte layers comprise a chalcogenide material.

7. A programmable metallization cell (PMC) comprising:
an electrochemically active electrode and an inert electrode; and
a variable resistive element separating the electrochemically active electrode from the inert electrode, the variable resistive element comprising a plurality of alternating and parallel solid electrolyte layers and electrically conductive metal layers, the solid electrolyte layers and the electrically conductive metal layers are parallel to each other and layered in an alternating fashion, the electrically conductive metal layers electrically couple the electrochemically active electrode to the inert electrode, and the electrically conductive metal layers directly contact and extend from the electrochemically active electrode and directly contact the inert electrode, in a low resistance state.

8. A PMC according to claim 7 wherein the electrically conductive metal layers are spaced apart by the solid electrolyte layers.

9. A PMC according to claim 7 wherein a surface place of the plurality of alternating solid electrolyte layers and electrically conductive metal layers is orthogonal to a surface plane of the active electrode or the inert electrode.

10. A PMC according to claim 9 wherein the electrochemically active electrode and the inert electrode are parallel.

11. A PMC according to claim 7 wherein the electrically conductive metal layers have a thickness of less than 100 Angstroms.

12. A PMC according to claim 7 further comprising a switching layer separating the variable resistive element from either the electrochemically active electrode or the inert electrode, wherein the switching layer is a composite of conductive and insulative material containing localized regions of higher current densities.

13. A PMC according to claim 12 wherein the switching layer comprises a solid electrolyte.

14. A PMC according to claim 7 wherein the electrically conductive metal layers comprise silver or copper.

15. A PMC according to claim 7 wherein the electrically conductive metal layers comprise an electrochemically inert metal.

* * * * *